(12) United States Patent
Lee

(10) Patent No.: US 6,695,546 B2
(45) Date of Patent: Feb. 24, 2004

(54) SINGLE DRIVE ALIGNER ELEVATION APPARATUS FOR AN INTEGRATED CIRCUIT HANDLER

(75) Inventor: Dong Suh Lee, Seoul (KR)

(73) Assignee: Mirae Corporation, Choongchungnam (KR)

( * ) Notice: Subject to any disclaimer, the term of this patent is extended or adjusted under 35 U.S.C. 154(b) by 141 days.

(21) Appl. No.: 10/093,393

(22) Filed: Mar. 11, 2002

(65) Prior Publication Data

US 2002/0090288 A1 Jul. 11, 2002

Related U.S. Application Data

(63) Continuation-in-part of application No. 09/536,783, filed on Mar. 28, 2000.

(51) Int. Cl.$^7$ ............................................... B65G 55/16
(52) U.S. Cl. ...................................................... 406/88
(58) Field of Search ........................ 414/222.04, 226.04, 414/676; 406/88, 14, 16; 198/345.1, 456; 187/636, 267, 406, 214, 210

(56) References Cited

U.S. PATENT DOCUMENTS

| | | | | |
|---|---|---|---|---|
| 5,227,717 A | * | 7/1993 | Tsurishima et al. | 324/754 |
| 5,290,134 A | * | 3/1994 | Baba | 414/404 |
| 6,388,457 B1 | * | 5/2002 | Loh et al. | 324/755 |
| 6,445,977 B1 | * | 9/2002 | Hwang et al. | 700/228 |
| 2002/0195314 A1 | * | 12/2002 | Cho et al. | 198/346.3 |

* cited by examiner

*Primary Examiner*—Donald P. Walsh
*Assistant Examiner*—Kenneth W Bower
(74) *Attorney, Agent, or Firm*—Rosenberg, Klein & Lee

(57) ABSTRACT

An elevation apparatus for a handler used for loading/unloading integrated circuit devices into/from a test tray is provide that includes an up/down block slidably mounted to be vertically displaceable with respect to a base plate. A nozzle block is affixed to the up/down block for displacement therewith. An aligner assembly is disposed above the nozzle block and supported by a pair of upper base blocks that are slidably mounted for displacement relative to the base plate. An elastically coupling assembly couples the pair of upper base blocks to the up/down block, the elastic coupling assembly upwardly displacing the pair of upper base blocks responsive to a corresponding upward displacement of the up/down block. The apparatus also includes a drive assembly secured to the base plate and coupled to the up/down block for vertically displacing the up/down block. The drive assembly is driven to first provide a long-up operation, where the up/down block is displaced to displace the aligner assembly into contact with a test tray and provide support thereof. The drive assembly is secondly driven to provide a short-up operation, where the up/down block is displaced to displace the test tray into contact with a plurality of supporting jaws. Then, the drive assembly is thirdly driven to displace the up/down block to now displace the nozzle block into contact with the aligner assembly, while the displacement of the aligner assembly is blocked by the contact between the test tray and the supporting jaws. The elastic coupling assembly elastically compensates for the third displacement of the up/down block.

9 Claims, 6 Drawing Sheets

SINGLE DRIVE ALIGNER ELEVATION APPARATUS FOR AN INTEGRATED CIRCUIT HANDLER

CROSS-REFERENCE TO RELATED APPLICATIONS

This Application is a Continuation-in-Part Application of copending Application Ser. No. 09/536,783, filed Mar. 28, 2000, and entitled "AN ALIGNER ELEVATION APPARATUS FOR A HANDLER".

BACKGROUND OF THE INVENTION

1. Field of the Invention

The present invention relates to an aligner elevation apparatus for an integrated circuit handler. More particularly, the present invention is directed to an aligner elevation apparatus, wherein the apparatus is operated to raise an aligner of an integrated circuit exchanger through the use of a single driving motor when the integrated circuit devices are loaded/unloaded into/from a test site, and then operated to accurately place the integrated circuit devices in carrier modules of test trays, and not damage the devices.

2. Prior Art

Manufactured integrated circuit devices are transferred using a horizontal or vertical-type elevator and then sequentially deposited in a plurality of carriers mounted on test trays, for testing of the devices.

The devices that are sequentially deposited in the test trays are supplied to a heating chamber that has been set to a predetermined temperature suitable for the performance of the tests of the devices, and are then heated to a higher temperature, followed by electrical contact with a testing section in a test site and the performance of tests on the devices.

The devices that have been tested according to the above procedures are subsequently classified into different classifications, depending upon the test results. The classified devices are put in the test trays associated with the individual classifications. The sorted devices are then further classified into a passed or failed category, based upon error detection by the testing equipment. The passed devices are available as the final products, and the failed devices are discarded.

The devices supplied from the elevator in a loading section are put in the test trays and then elevated. When the test tray reaches a maximum raised position of the elevator, a tray transferring unit is moved upward in order to capture the elevated trays and to then position them into respective loading sections.

Meanwhile, each of he devices, contained in the trays having been moved by the tray transferring unit, is held by vacuum from a picker, which moves the held device into the heating chamber, during which the alignment of the device is made.

The alignment of the device includes, after the picker engages each device by a vacuum nozzle, depositing the device into a buffer, then vacuum engaging each device by the picker from the buffer and supplying it to an exchanger. The exchanger is provided with an aligner for accurately placing the device that has been moved by the picker, in place. Subsequent to an elevating operation of the aligner, the positioning of the device is made.

Such an elevating operation of the aligner serves two functions, providing positional stability of the device in the test tray and accurate placement of the device therein. To this end, the elevating operation consists of a long-up operation where a body of the exchanger is raised, and a short-up operation where the aligner of the exchanger is raised to accurately seat the device.

The vertical displacement motions in the long-up and short-up operations are respectively made by two pairs of pneumatic cylinders, each pair being installed in the exchanger. Specifically, the operation of one of the two pairs of cylinders, installed in both sides of the exchanger, permits a stroke movement of the body of the exchanger, so that the body reaches a predetermined position. Thereafter, the other two cylinders again raise the aligner, which aligner accurately deposits the device, that is seated on the top portion of the aligner, in the test tray.

However, the above-mentioned long-up and short-up operations accompanies an occurrence of loud noise, as well as unwanted damage of the device. Further, in the case of employing two pairs of cylinders, the operation depends on the stroke of the cylinders, which operation causes deviation or breakage of the devices during the short-up operation, thus increasing the failure rate of the devices.

SUMMARY OF THE INVENTION

An elevation apparatus for a handler used for loading/unloading integrated circuit devices into/from a test tray is provided The apparatus includes an up/down block slidably mounted to be vertically displaceable with respect to a base plate. A nozzle block is affixed to the up/down block for displacement therewith. The nozzle block carries a plurality of nozzles respectively coupled to a vacuum source. An aligner assembly is disposed above the nozzle block and supported by a pair of upper base blocks that are slidably mounted for displacement relative to the base plate. An elastically coupling assembly couples the pair of upper base blocks to the up/down block, the elastic coupling assembly upwardly displacing the pair of upper base blocks responsive to a corresponding upward displacement of the up/down block. The apparatus also includes a drive assembly secured to the base plate and coupled to the up/down block for vertically displacing the up/down block. The drive assembly is driven to first provide a long-up operation, where the up/down block is displaced to displace the aligner assembly into contact with a test tray and provide support thereof. The drive assembly is secondly driven to provide a short-up operation, where the up/down block is displaced to displace the test tray into contact with a plurality of supporting jaws. Then, the drive assembly is thirdly driven to displace the up/down block to now displace the nozzle block into contact with the aligner assembly, while the displacement of the aligner assembly is blocked by the contact between the test tray and the supporting jaws. The elastic coupling assembly elastically compensates for the third displacement of the up/down block. Thus, a single driving device, such as a motor driven ball screw, is used for all three of the aforementioned displacement steps, without requiring the use of pneumatic or hydraulic cylinders, or other linear displacement devices for the final positioning of the nozzle assembly. By that arrangement, the equipment can be made smaller and damage to the integrated circuit devices can be prevented.

DESCRIPTION OF THE PREFERRED EMBODIMENT

Figure 1:
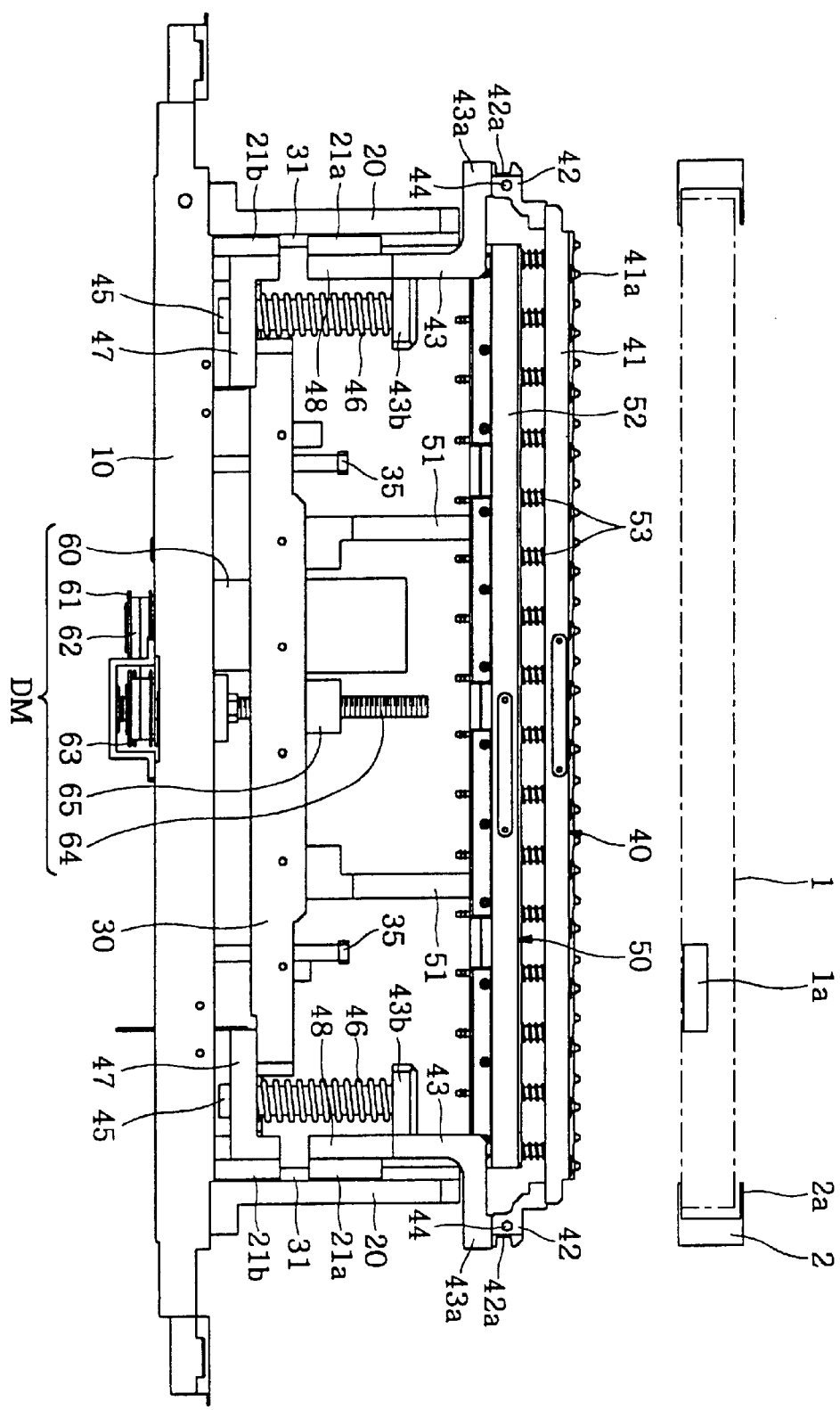
FIG. 1 is a sectional view of an aligner assembly of the handler according to the present invention in an initial position.

A preferred embodiment of the present invention will now be described with reference to the accompanying drawings.

The device aligner of the handler according to the present invention, as shown in FIGS. 1–4, includes: a base plate 10; a guide post 20 installed at both left and right sides of the base plate 10; an up/down block 30 installed inside the guide post 20 so that it can go up or down; a driving means DM for displacing the up/down block 30 upwardly and downwardly; an aligner assembly 40 installed so as to be displaced up or down according to the up/down operation of the up/down block 30; and a nozzle assembly 50 installed between the up/down block 30 and the aligner assembly 40. The handler includes a device for loading/unloading a device to be tested to a test tray 1.

In addition, a linear motion block 21b is installed inside each guide post 20 in order to guide the up/down operation of the up/down block 30, and a linear motion guide 31 is installed inside each guide post 20 for sliding of the linear motion blocks 21a and 21b thereon.

A respective stopper 35 for limiting the movement of the up/down block 30 is installed at both sides of the up/down block 30 at a predetermined interval. When, the up/down block 30 goes up, the aligner assembly 40 goes up accordingly by the spring tension of a pair of coil springs 46, to be further described in following paragraphs. The aligner assembly 40 ceases to go up once it has reached a predetermined position, only the up/down block 30 and the nozzle assembly 50 can then go up further.

The driving means DM includes: a driving motor 60; a driving pulley 61 installed below the base plate 10 and being drivingly rotated by the operation of the driving motor 60; a driven pulley 63 rotatably coupled to the driving pulley 61 by a belt 62; a ball screw 64 coupled to the driven pulley for rotation therewith passes through the base plate 10 and the up/down block 30; a ball screw nut 65 threadedly engaged to the ball screw 64 and fixed to the up/down block 30 converts the rotary motion of the ball screw 64 into a linear displacement of the up/down block 30.

The aligner assembly 40 includes: an aligner block 41 having a plurality of position fixing pins 41a on the upper surface and a respective connecting block 42 of a stepwise type at two sides of the aligner block 41. The aligner assembly 40 can go up and down in accordance with the upward and downward operation of the up/down block 30.

Each connecting block 42 of the aligner assembly 40 is connected to one side of the upper portion 43a of a respective upper base block 43 by a locking pin 44. A guide block 48 is installed below each upper base block 43 and coupled thereto. Each guide block 48 is connected to a respective linear motion block 21a, and a pair of lower base blocks 47 respectively coupled on two ends of the up/down block 30, are each connected to a respective linear motion block 21b.

A guide pin 45 extends from a central portion of a lower side of the lower portion 43b of each upper base block 43 to pass through a corresponding opening in a respective lower base block 47. A coil spring 46 is installed on each guide pin 45 to be disposed between a respective lower base block and a lower portion 43b of a respective upper base block 43.

The nozzle assembly 50 includes a nozzle block 52 fixed to a pair of columns 51 extending from the top surface of the up/down block 30, and a plurality of nozzles 53 installed through the nozzle block 52. The nozzles 53 have a distal end coupled to a vacuum source and provide the means to hold the devices to be tested, preventing their agitation or inadvertent displacement.

Figure 5:
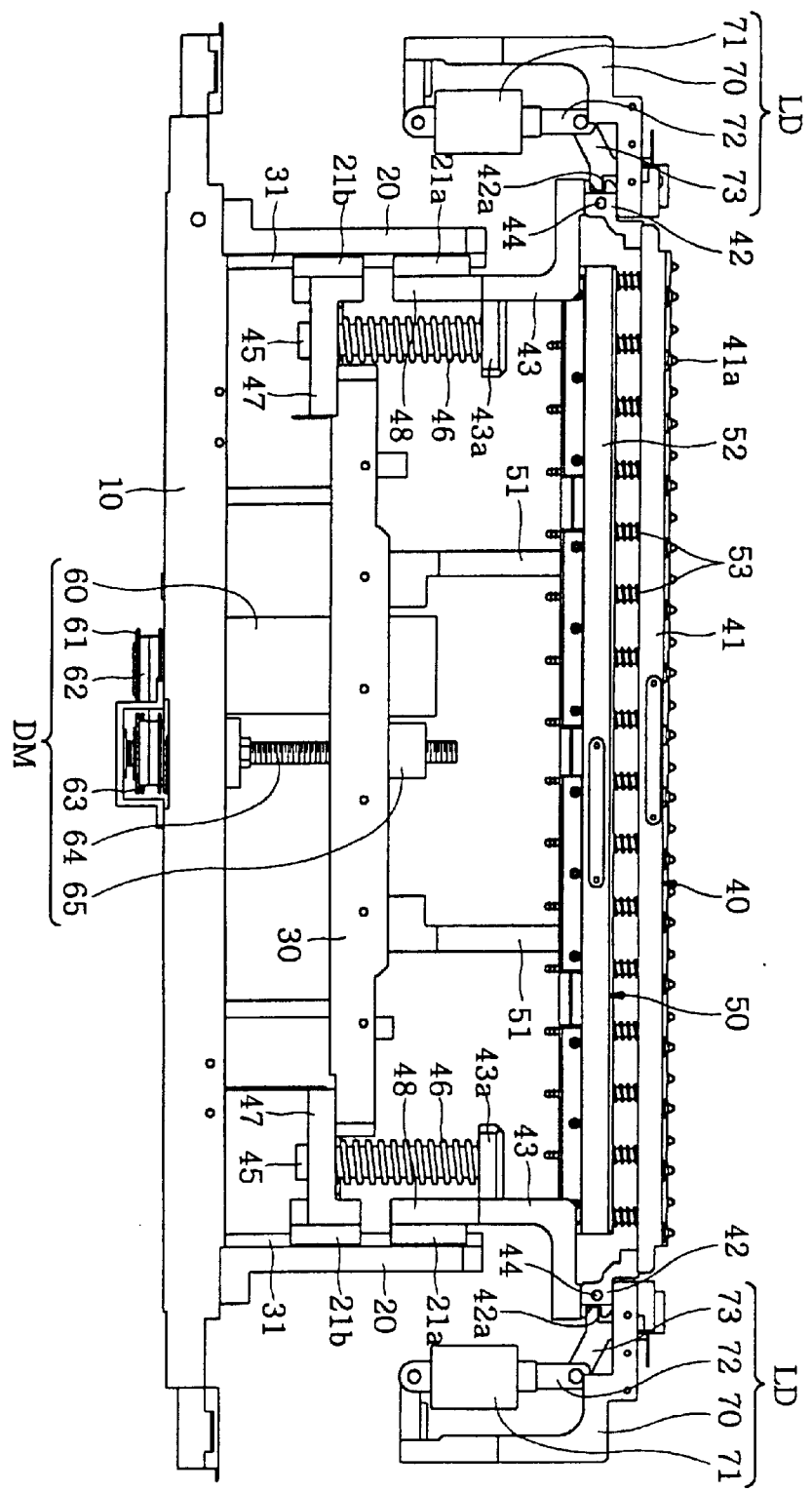
FIG. 5 is a sectional view showing a locking state of the aligner.

Further, as shown in FIG. 5, a locking device LD for locking each end of the aligner assembly 40 includes: a cylinder 71 pivotally fixed to a frame 70; and a locking member 73 pivotally connected to a rod 72 of the cylinder 71 and selectively insertable into a lock groove 42a formed in a respective connecting block 42 of the aligner assembly 40, while pivoting responsive to the up operation of the rod 72.

When the position of the aligner assembly is set, the aligner locking devices LD are operated. With respect to each aligner locking device LD, as shown in FIG. 5, when the rod 72 is moved to a lower direction by the driving of the cylinder 71, a locking member 73 is rotated in one direction to be inserted into a corresponding locking groove 42a of a respective connecting block 42, at both sides of the aligner assembly 40, for thereby maintaining the setting position of the aligner assembly 40. The cylinder 71 may be a hydraulic or pneumatic cylinder, or an electrical solenoid.

When the rod 72 is moved to an upper direction, the locking member 73 is removed from the corresponding locking groove 42a of the respective connecting block 42 while rotating, at both sides of the aligner assembly 40, and thus it is released from the aligner assembly 40.

An aligning method of the constructed device aligner of the handler according to the present invention will now be described. For reference, although not shown in the present invention, a single shaft picker is installed at both left and right sides of a robot of the handler, and two nozzles are mounted at the single shaft picker. The picker serves to move the device from a buffer to an aligner when loading it, and move the device from the aligner to the buffer when unloading it.

Figure 6:
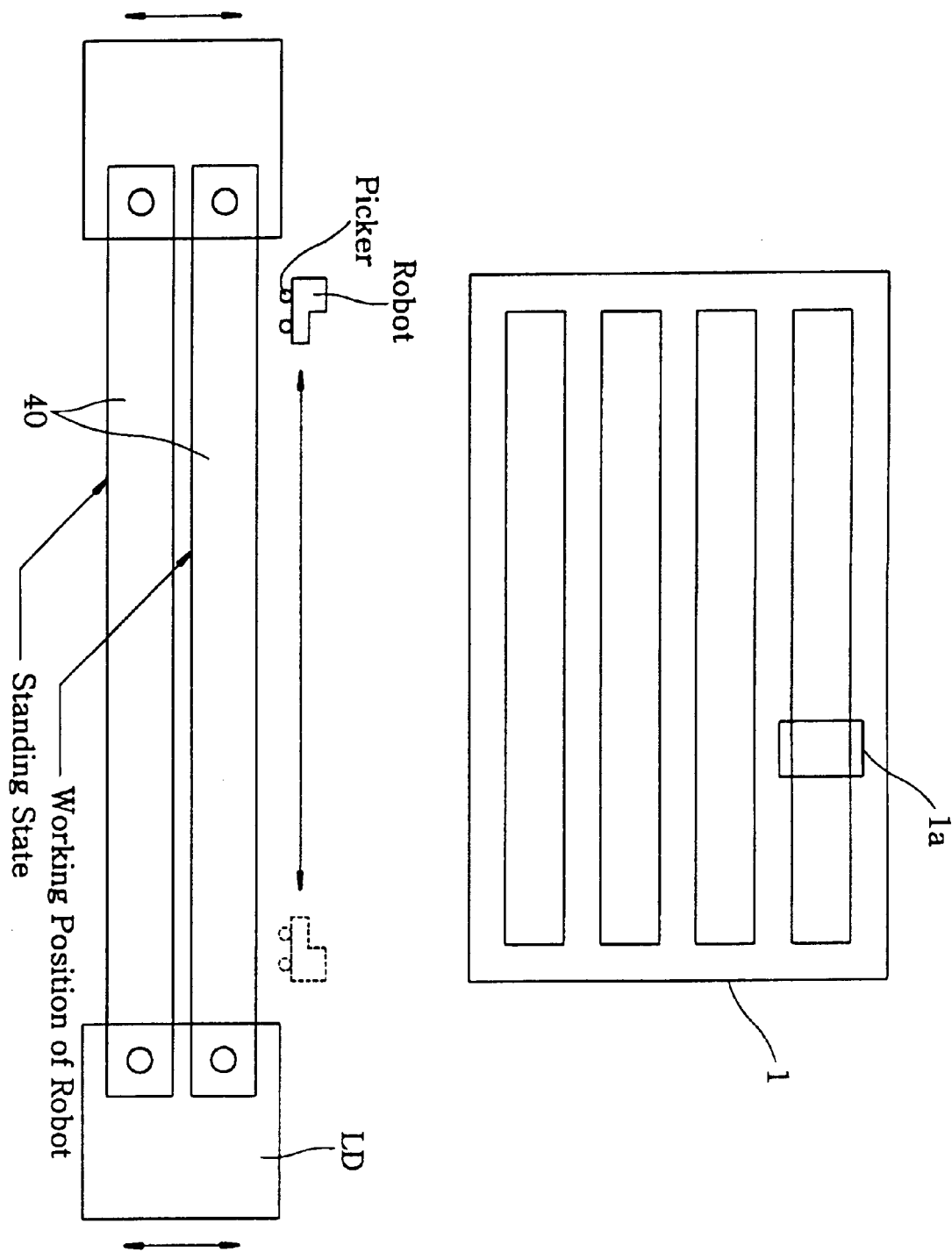
FIG. 6 is a plan view depicting a working site of the present invention.

The picker, as illustrated in the plan view of the working site of FIG. 6, performs its operation while moving with respect to the aligner assembly 40. The aligner assembly 40 is locked by the locking device LD. When the device is being mounted to the aligner assembly 40, the aligner assembly 40 is unlocked by the locking device LD and then the device is moved to a test tray 1 to thus perform a test procedure. The device is mounted to a carrier 1a.

Meanwhile, with the test tray 1 mounted in a tray guide 2, the driving of the aligner is initiated, and the aligner up operation is achieved by three steps.

[Step 1]

Figure 2:
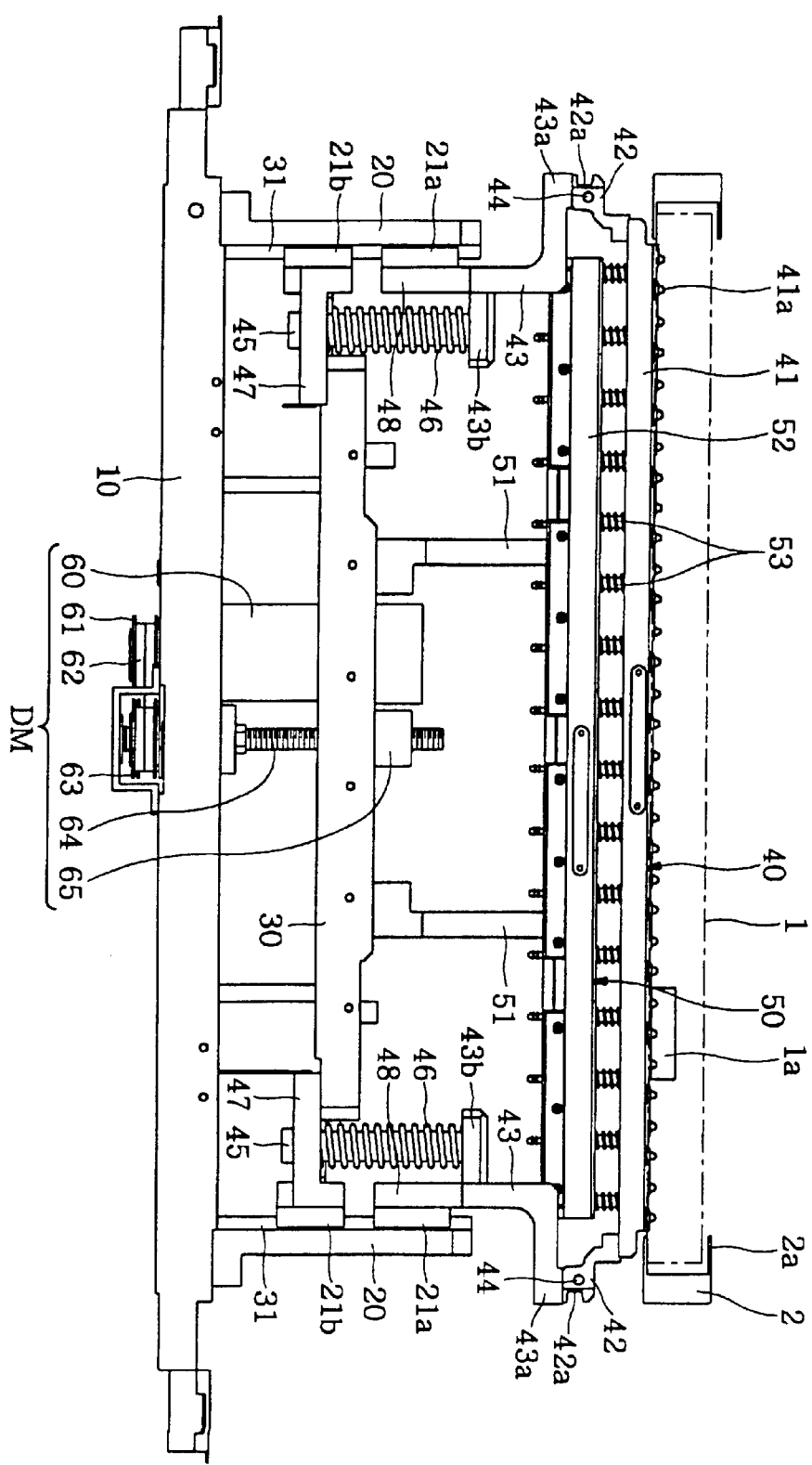
FIG. 2 is a sectional view depicting a long-up operation of the aligner.

As shown in FIG. 2, in Step 1, the aligner assembly 40 is moved up from an initial position, shown in FIG. 1, to the state where the top surface of the aligner block 41 is spaced from the bottom surface of the test tray 1 by approximately 0.5~1 mm, which displacement is referred as a so-called long-up operation.

More specifically, the driving pulley 61 is rotated by the driving force of the driving motor 60, and the ball screw 64 is rotated when the driven pulley 63 is rotated by the rotation force of the driving pulley 61 transferred via the belt 62. The rotation motion of the ball screw 64 is converted to a linear motion through the ball screw nut 65 to thereby displace the up/down block 30 upwardly. The up/down block 30 is guided as it moves upward by the linear motion blocks 21b, coupled to respective lower base blocks 47, that are slidingly coupled to corresponding linear motion guides 31.

Moreover, by virtue of the upward displacement of the up/down block 30, the aligner assembly 40 is upwardly displaced up by the spring tension of the coil springs 46 (the springs having a large spring constant), to thereby be disposed at the bottom surface of the test tray 1. The connecting blocks 42 are connected to the aligner block 41 and are connected to respective upper base blocks 43. Each upper base block 43 is connected to a linear motion block 21a by means of a corresponding the guide block 48 connected therebetween. Each linear motion block 21a is installed so that it can slide along the corresponding linear motion guide 31. Therefore, when the up/down block 30 moves upward, the upper base block 43 is moved in an upward direction by the spring tension of the coil springs 46, the up/down block 30 being stopped when the aligner block 41 reaches the bottom surface of the test tray 1.

In that state, the aligner assembly 40 has been displaced by a long-up operation. At this time, a check is made to determine whether a device is present or not by a vacuum test of the nozzles 53. If a device is present at a particular nozzle 53, than the pressure in the associated vacuum line will decrease by a substantial amount. Where no device is present, the nozzle will be open to the atmosphere ant the pressure in the associated vacuum line will not decrease to the same degree as when a device overlays the nozzle. Thus, by monitoring the pressure in the vacuum lines coupled to the nozzles 53, the presence or absence of a device can be determined.

[Step 2]

Figure 3:
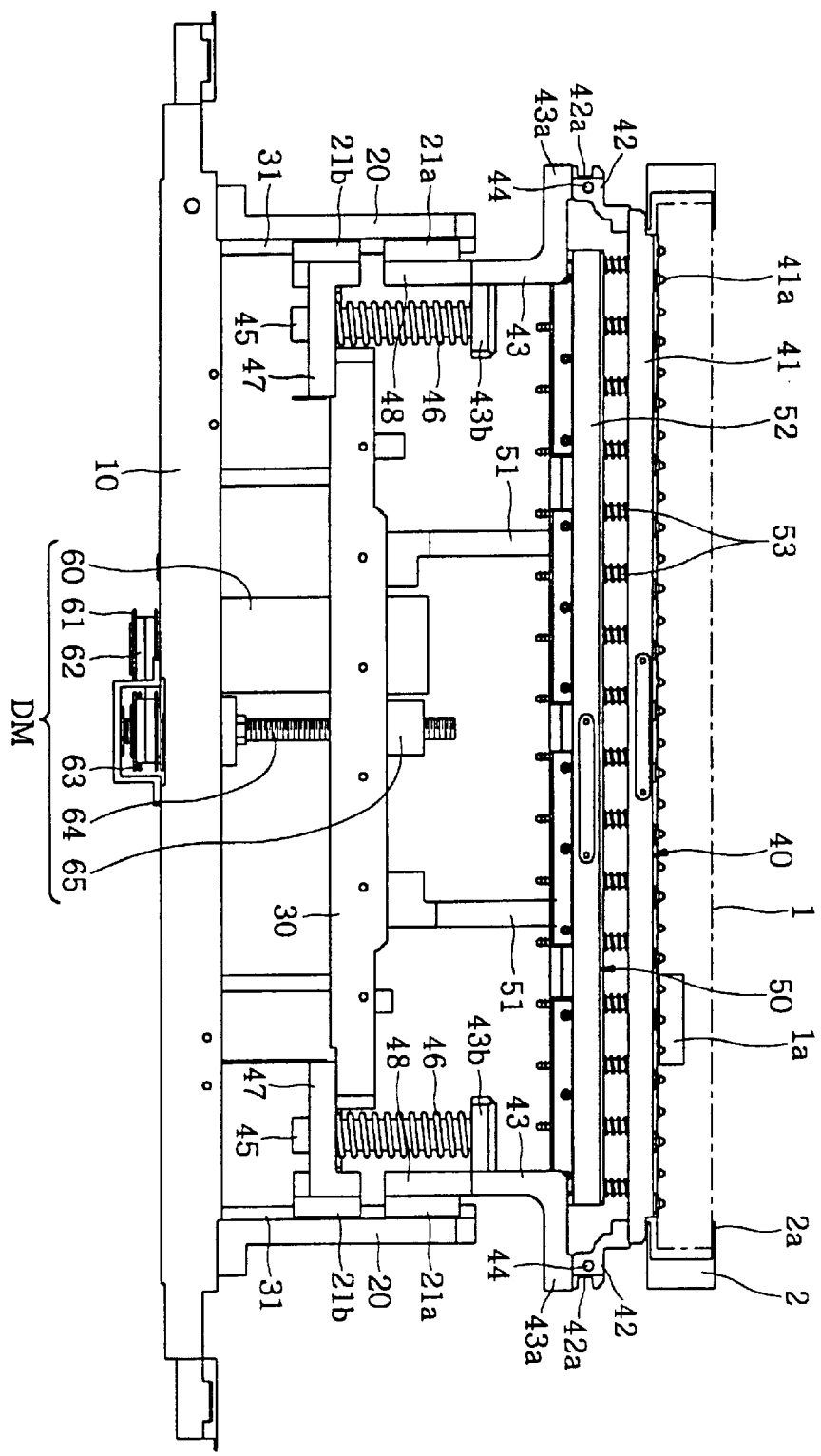
FIG. 3 is a sectional view depicting a short-up operation of the aligner.

As illustrated in FIG. 3, in Step 2, the aligner assembly 40 is upwardly displaced a small distance by further driving of the ball screw 64, displacing the up/down block 30 upwardly to in-turn displace the aligner assembly 40 by virtue of the coil springs 46, so that the top surface of the test tray 1 contacts an upper supporting jaw 2a of a respective tray guide 2. This secondary displacement of the aligner assembly 40 is referred to as a short-up operation.

When the aligner assembly 40 goes up, the position fixing pin 41a of the aligner block 41 is inserted into a position fixing groove (not shown) of the test tray 1 and accordingly the test tray 1 moves upward in a stable manner along with the aligner assembly 40. When the tray 1 has contacted the upper supporting jaw 2a of the tray guides 2, the aligner assembly 40 no longer moves up, but is biased by the springs 46 to maintain intimate contact with the test tray 1 by any further displacement of the up/down block 30.

[Step 3]

Figure 4:
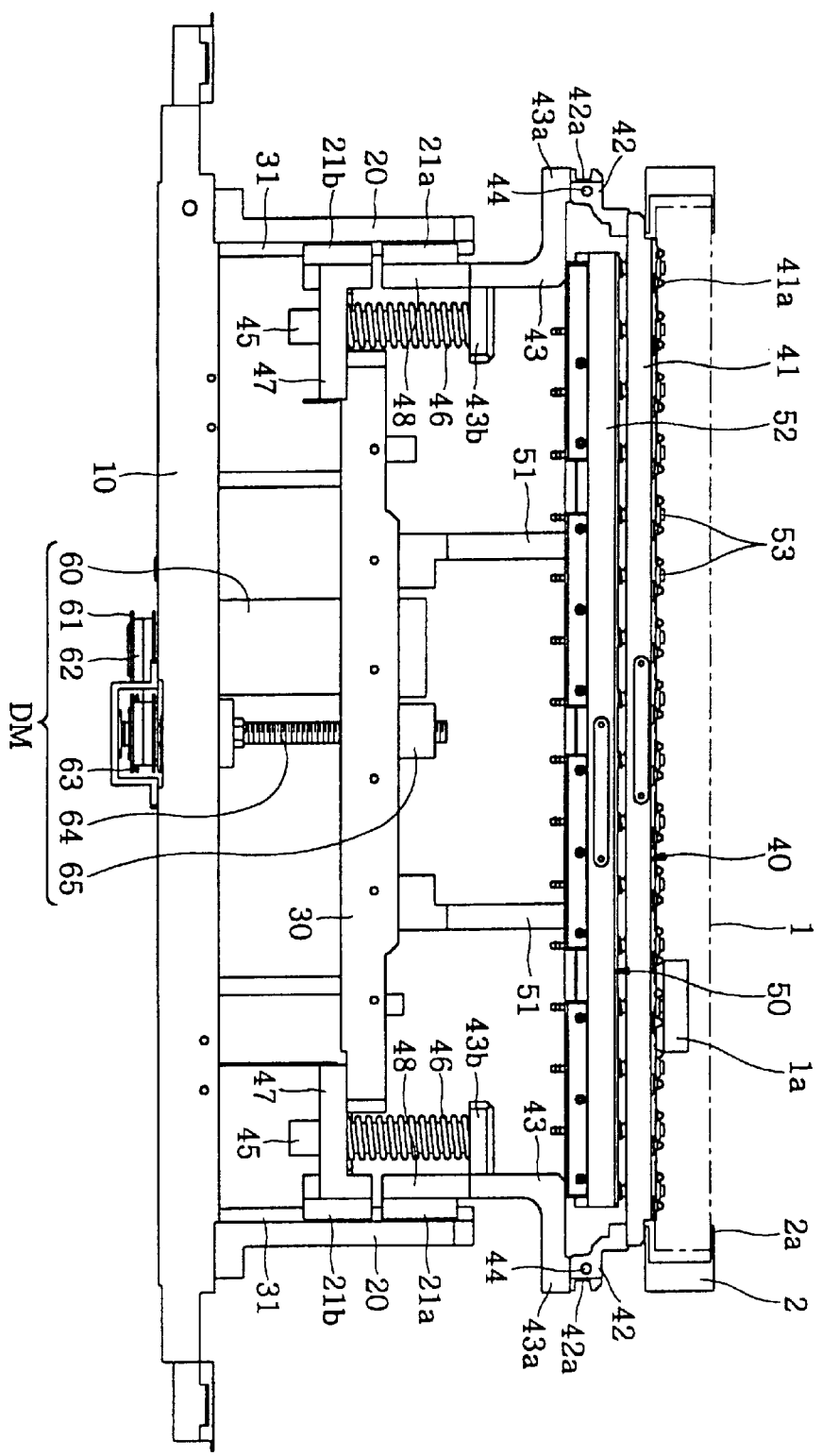
FIG. 4 is a sectional view depicting a nozzle-up operation of the aligner.

As illustrated in FIG. 4, in Step 3, from the state of the test tray 1 being supported by the upper supporting jaw 2a of the tray guide 2 by the aligner assembly 40, the nozzle assembly 50 is moved up and the nozzles 53 are installed at the test tray 1 for clamping/unclamping the device, by pushing or pulling a fork (not shown). This movement is referred to as a nozzle-up operation.

In Step 3, the up/down block 30 is further displaced upwardly from the position in Step 2, by operation of the driving motor 60 to rotate the ball screw 64. At this time, since the aligner assembly 40 does not move up any further, the coil springs 46 are compressed, and only the nozzle assembly 50 is displaced upwardly along with the up/down block 30.

When the nozzle assembly 50 goes up, the devices to be tested are aligned at the test tray 1 by respective pressing/releasing forks (not shown) of the carrier 1a for clamping/unclamping the devices inserted into the test tray 1. Accordingly, the devices can be aligned at a setting position even if the devices cannot be aligned by vacuum suction of a corresponding nozzle, thereby preventing a malfunction at the pickup operation of the device.

In addition, by using the one driving motor for all three of the aforementioned steps, without requiring the use of pneumatic or hydraulic cylinders, or other linear displacement devices for the final positioning of the nozzle assembly, the equipment can be made smaller and damage to the integrated circuit devices can be prevented.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. An elevation apparatus for a handler used for loading/unloading integrated circuit devices into/from a test tray, the apparatus comprising:

a base plate;

a pair of guide posts extending vertically from said base plate in spaced relationship;

an up/down block slidably mounted to said pair of guide posts, said up/down block including a pair of columns extending vertically therefrom;

a nozzle block affixed to said columns for displacement therewith, said nozzle block carrying a plurality of nozzles respectively coupled to a vacuum source;

a pair of upper base blocks slidably disposed on said pair of guide posts;

an aligner assembly disposed above said nozzle block and supported by said pair of upper base blocks;

a pair of springs respectively disposed between said up/down block and said pair of upper base blocks, said pair of spring having a sufficiently high spring constant to upwardly displace said pair of upper base blocks responsive to a corresponding upward displacement of said up/down block;

a drive assembly secured to said base plate and coupled to said up/down block for vertically displacing said up/down block, said drive assembly being driven to first displace said up/down block and said aligner assembly therewith into contact with a test tray, followed by a second displacement of said up/down block to displace the test tray into contact with a plurality of supporting jaws, and then followed by a third displacement of said up/down block to displace said nozzle block into contact with said aligner assembly, displacement of said aligner assembly being blocked by said contact between the test tray and the supporting jaws, wherein said pair of springs are compressed by said third displacement of said up/down block.

2. The apparatus as recited in claim 1, wherein said drive assembly includes a ball screw rotatably mounted to said base plate and coupled to said up/down plate by a ball screw nut for vertically displacing said up/down block responsive to rotation thereof; and a driving motor mounted to the base plate and drivingly coupled to said ball screw for rotation thereof.

3. The apparatus as recited in claim 2, wherein said drive assembly further includes a first pulley connected to the driving motor, a second pulley to a lower portion of the ball screw, and a continuous belt wound around said first and second pulleys.

4. The apparatus as recited in claim 1, wherein each of said pair of upper base blocks includes a guide pin extending from a lower side thereof for supporting a respective one of said pair of springs thereon.

5. An elevation apparatus for a handler used for loading/unloading integrated circuit devices into/from a test tray, the apparatus comprising:

a base plate;

a pair of guide posts extending vertically from said base plate in spaced relationship;

an up/down block slidably mounted to said pair of guide posts, said up/down block including a pair of columns extending vertically therefrom;

a nozzle block affixed to said columns for displacement therewith, said nozzle block carrying a plurality of nozzles respectively coupled to a vacuum source;

a pair of upper base blocks slidably disposed on said pair of guide posts;

an aligner assembly disposed above said nozzle block and supported by said pair of upper base blocks;

means for elastically coupling said a pair of upper base blocks to said up/down block, said elastic coupling means upwardly displacing said pair of upper base blocks responsive to a corresponding upward displacement of said up/down block; and, a drive assembly secured to said base plate and coupled to said up/down block for vertically displacing said up/down block, said drive assembly being driven to first displace said up/down block and said aligner assembly therewith into contact with a test tray, followed by a second displacement of said up/down block to displace the test tray into contact with a plurality of supporting jaws, and then followed by a third displacement of said up/down block to displace said nozzle block into contact with said aligner assembly, displacement of said aligner assembly being blocked by said contact between the test tray and the supporting jaws, wherein said elastic coupling means elastically compensates for said third displacement of said up/down block.

6. The apparatus as recited in claim 5, wherein elastic coupling means includes a pair of springs respectively disposed between said up/down block and said pair of upper base blocks.

7. The apparatus as recited in claim 5, wherein said drive assembly includes a ball screw rotatably mounted to said base plate and coupled to said up/down plate by a ball screw nut for vertically displacing said up/down block responsive to rotation thereof; and a driving motor mounted to the base plate and drivingly coupled to said ball screw for rotation thereof.

8. The apparatus as recited in claim 7, wherein said drive assembly further includes a first pulley connected to the driving motor, a second pulley to a lower portion of the ball screw, and a continuous belt wound around said first and second pulleys.

9. The apparatus as recited in claim 6, wherein each of said pair of upper base blocks includes a guide pin extending from a lower side thereof for supporting a respective one of said pair of springs thereon.

* * * * *